United States Patent [19]

Mizuta

[11] Patent Number: 5,745,773
[45] Date of Patent: Apr. 28, 1998

[54] MEMORY CARDS WITH SRAM USABLE FOR A PC CARD IN CONFORMITY WITH PCMCIA STANDARD

[75] Inventor: Masaharu Mizuta, Tokyo, Japan

[73] Assignee: Mitsubishi Denki Kabushiki Kaisha, Tokyo, Japan

[21] Appl. No.: 713,645

[22] Filed: Sep. 13, 1996

[30] Foreign Application Priority Data

Mar. 8, 1996 [JP] Japan .................. 8-051526

[51] Int. Cl.[6] .................................................. G06F 1/32
[52] U.S. Cl. .................. 395/750.03; 395/750.05; 365/227; 365/229
[58] Field of Search .................. 395/750.03, 750.05; 365/227, 229

[56] References Cited

U.S. PATENT DOCUMENTS

| | | | |
|---|---|---|---|
| 5,134,616 | 7/1992 | Barth, Jr. et al. | 371/10.3 |
| 5,546,590 | 8/1996 | Pierce | 395/750.05 |
| 5,590,342 | 12/1996 | Marisetty | 395/750.06 |
| 5,606,704 | 2/1997 | Pierce et al. | 395/750.04 |

FOREIGN PATENT DOCUMENTS

| | | | |
|---|---|---|---|
| 3-204745 | 9/1991 | Japan | G06F 17/00 |
| 6-89595 | 3/1994 | Japan | G11C 29/00 |
| 6-131884 | 5/1994 | Japan | G11C 16/06 |
| 7-21791 | 1/1995 | Japan | G11C 16/06 |

*Primary Examiner*—Jack B. Harvey
*Assistant Examiner*—Jeffrey K. Seto

[57] ABSTRACT

The memory card with an ECC circuit for adding $ECC_S$ to main data to be stored comprises a memory consisting of SRAM, a detection circuit for detecting the frequency of data access operation to the memory and a power supply voltage converter for lowering the power supply voltage provided from an external information processor when the frequency of data access is less than the predetermined threshold.

4 Claims, 2 Drawing Sheets

MEMORY CARDS WITH SRAM USABLE FOR A PC CARD IN CONFORMITY WITH PCMCIA STANDARD

BACKGROUND OF THE INVENTION

1. Field of the Invention

The present invention relates to a memory card of low power consumption with high reliability by means of the ECC (error correcting code) which employs SRAM, conforms to the ATA standard, and is used as a PC card in conformity with the PCMCIA standard.

2. Description of the Related Art

FIG. 4 illustrates a schematic block diagram of a conventional memory card used as a PC card, implemented with SRAM, in conformity with the PCMCIA standard.

A conventional memory card 50 using SRAM as shown in FIG. 4 is constructed to conform to the PCMCIA standard and comprises an interface connector 51 for coupling to an information processing device 70, an input buffer circuit 52, an input/output buffer circuit 53, a memory portion 54, and an ECC circuit 55. Memory portion 54 comprises a main memory 56 for storing main data and an ECC memory 57 for storing the ECC of the main data, each implemented with SRAM memory. Although an actual memory card should have a backup battery circuit for retaining data stored in memory portion 54, it is not shown in FIG. 4 for simplification.

Control signals from external information processing device 70, such as an address signal and a write enable signal, are provided to input buffer circuit 52 through interface connector 51. The signals are then transferred to memory portion 54 from the input buffer circuit 52. Data signals of main data from external information processing device 70 are fed to input/output buffer circuit 53 through interface connector 51. The data signals are then transferred from the input/output buffer circuit 53 to ECC circuit 55 where ECCs are added to the input main data. ECC circuit 55 outputs the input main data to main memory 56 and the ECCs of the main memory to ECC memory 57. Thus the main data is stored in IC memory forming main memory 56, while the ECCs are stored in IC memory forming ECC memory 57.

Most errors which occur in a 4 Mbit medium capacity SRAM memory and 16 Mbit large capacity SRAM memory used for main memory 56 and ECC memory 57 are caused by a one-bit error which occurs at random positions throughout the memory. The random one-bit error, such as data loss, is typically corrected using a well-known method in which an ECC or redundant data is added to a main data. In the example in which an error detection is performed for two bits and an error correction is done for one bit, the necessary number of bits for an ECC must satisfy the following inequality:

$$2^{(k-1)} - 1 \geq m + k \quad (1)$$

where k and m are the number of bits of an ECC and a main data, respectively.

In a case in which the bit number m for a main data is 8, the bit number k for the ECC associated with the main data will be 5 according to Equation (1). Therefore, the read and write of data must be performed in units of 13 bits, the sum of the 8 bits of the main data and the 5 bits of the ECC data. An ordinary IC memory is configured so that an 8-bit data is stored in one address. (This configuration is referred to as the x8 configuration hereinafter.) However, no IC memory has a configuration in which a 5-bit data is stored in one address. (This configuration is referred to as the x5 configuration hereinafter.) Therefore, if main memory 56 for storing main data comprises an IC memory of 4 Mbits (512 kB×8 bits), ECC memory 57 for storing ECC data must also use a 4 Mbits IC memory.

SUMMARY OF THE INVENTION

The present invention provides a memory card, with improved reliability by means of the ECC and in conformity with the ATA standard, which is used as a PC card in conformity with the PCMCIA standard. The memory card comprises a memory portion employing SRAM, a detection portion for detecting the frequency of the data access operations to the memory portion and for producing a predetermined detection signal when the detected frequency is lower than a predetermined value, and a power supply voltage converter for converting the power supply voltage provided from an external information processing device when receiving the predetermined detection signal from the detection portion and for supplying the converted voltage as a power supply voltage to the memory portion, wherein the power supply voltage converter lowers the power supply voltage for the memory portion when receiving the predetermined detection signal from the detection portion. The memory portion comprises a main memory portion for storing main memory and an ECC memory portion for storing ECCs generated for the main memory.

More particularly, the power supply voltage converter, when receiving the predetermined detection signal from the detection portion, lowers the power supply voltage Va, which is provided from an external information processing device and is needed for the memory portion to be in the active state in which the SRAM of the memory portion performs writing and reading operations, to the power supply voltage Vb which is the lowest voltage necessary for the SRAM to retain the stored data therein. Further, when the power supply voltage converter does not receive the predetermined detection signal from the detection portion, the converter supplies the memory portion with the same voltage Va as it receives from the external information processing device.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Embodiments:

The embodiments of the present invention are described with reference to accompanying drawings.

Embodiment 1.

Figure 1:
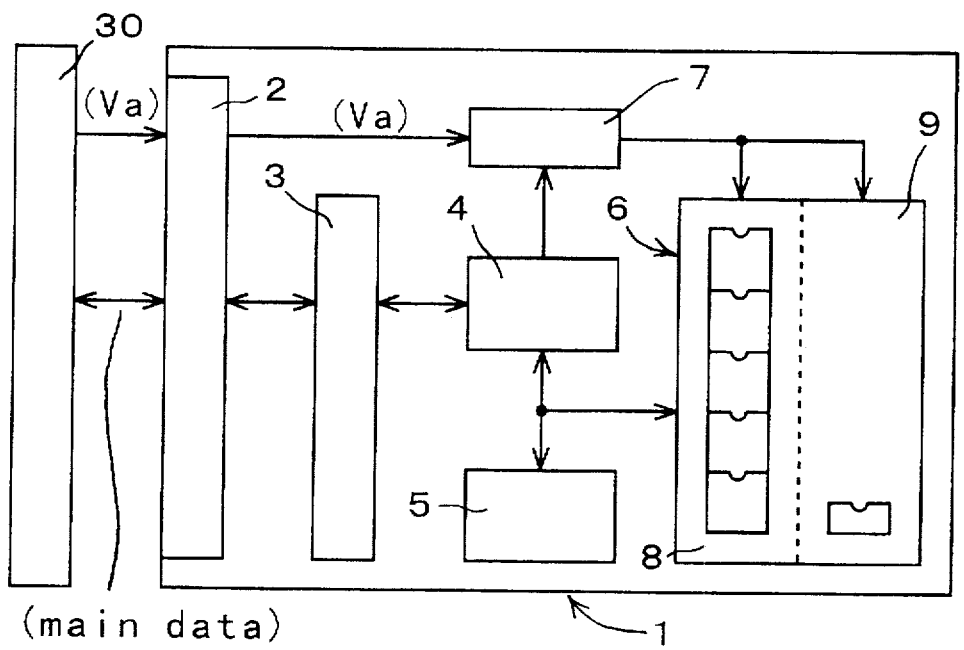
FIG. 1 is a schematic block diagram of the memory card of Embodiment 1 of the present invention.

FIG. 1 is a schematic block diagram showing a memory card of Embodiment 1 of the present invention.

Memory card 1 in FIG. 1 conforms to the PCMCIA standard and comprises an interface connector 2 for coupling to an information processing device 30 such as a personal computer, an interface IC circuit 3 in conformity with the PCMCIA standard, a controller 4 including a microcomputer and firmware, a buffer memory circuit 5 for temporarily storing data modified in the controller 4, a memory portion 6 formed with SRAM memory, and a power supply controller 7 for receiving a power supply voltage from external information processing device 30, modifying it, and providing the modified voltage to memory portion 6.

Memory portion 6 comprises a main memory 8 for storing main data and an ECC memory 9 for storing the ECCs of the main data, each implemented with SRAM memory. Power supply controller 7 modifies the power voltage supplied from the external information processing device 30 and provides memory portion 6 with the modified power voltage. For easier understanding, FIG. 1 does not show a backup battery circuit for retaining data stored in memory portion 6, but shows only the data flow between the external information processing device 30 and the memory card, the power supply paths to memory portion 6, and the flows of the signals for controlling the power voltage.

The main data from external information processing device 30 to be stored in memory portion 6 is provided to IC circuit 3 through connector 2 together with an address data and a write enable signal also from the external information processing device 30, and then transferred to controller 4 through IC circuit 3. Since memory card 1 is designed to conform to the ATA standard, the memory card must exchange data with external information processing device 30 in units of 512 bytes. Therefore, the main data provided to controller 4 is configured in units of 512 bytes and the controller 4 generates ECC for every 512 bytes of the main data received.

When memory portion 6 is formed with IC memory with x8 configuration, writing or reading can only be performed in units of 8 bits. The controller 4 first stores the main data with ECCs added thereto in buffer memory circuit 5 and then transfers the stored main data in units of 8 bits to main memory 8 and the ECC data to ECC memory 9 also in units of 8 bits. The memory capacity of buffer memory circuit 5 is determined by the writing and reading speeds of data to and from external information processing device 30, respectively, as well as the writing and reading speeds of memory portion 6.

When main data stored in memory portion 6 is retrieved to external information processing device 30, an address data and a write enable signal are provided from external information processing device 30 to IC circuit 3 through connector 2, and then transferred to controller 4 through IC circuit 3. Controller 4 first transfers the main data designated by information processing device 30 from main memory portion 8 to buffer memory circuit 5, and then transfers the ECC corresponding to the main data from ECC memory 9 to buffer memory circuit 5. Controller 4 checks for errors on the main data by means of the corresponding ECC and the main data itself stored in buffer memory circuit 5, then makes any necessary corrections, and outputs the corrected main data to information processing device 30 through IC circuit 3 and connector 2.

Controller 4 always monitors signals exchanged with external information processing device 30. If information processing device 30 performs the access operation to memory portion 6 less frequently than a predetermined value, controller 4 determines that the data access operation is in a dormant state and sends to power supply controller 7 a signal indicating that the controller has detected the data access operation to be in a dormant state. Thus, controller 4 is, in effect, the controller of a memory card for flash memory in conformity with both PCMCIA and ATA standards with modified firmware so that it is accessible to SRAM memory.

External information processing device 30 provides power supply controller 7 with power of DC voltage Va that is needed for the SRAM of memory portion 6 to be in an active state in which writing and reading are performed. When power supply controller 7 receives the dormant-state detection signal from controller 4, power supply controller 7 lowers the voltage Va to Vb, which is the lowest possible voltage for retaining the stored data in memory portion 6, and outputs the voltage Vb to memory portion 6.

When controller 4 senses more frequent access operations to memory portion 6 than the predetermined value, controller 4 turns off the dormant-state detection signal sent to power supply controller 7 and allows power supply controller 7 to output the same voltage Va as supplied from external information processing device 30 to memory portion 6. For SRAM memory, for example, if Va is DC 5 V (TYP value), Vb is about 3 V. Controller 4 forms the aforementioned detecting portion; power supply controller 7, the aforementioned voltage converting portion; main memory 8, the aforementioned main memory portion; and ECC memory 9, the aforementioned ECC memory portion.

Figure 2:
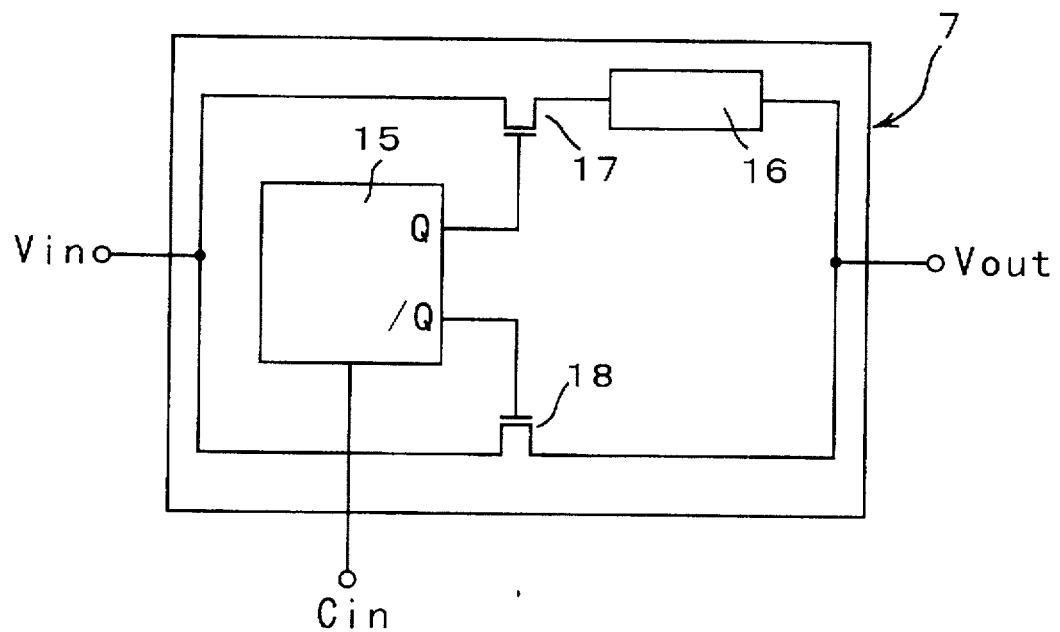
FIG. 2 is a schematic block diagram of the structure of power supply controller 7 shown in FIG. 1.

FIG. 2 is a schematic block diagram showing the structure of power supply controller 7.

As shown in FIG. 2, power supply controller 7 comprises a control circuit 15, a DC—DC converter 16, and two NMOS FETs 17 and 18. Control circuit 15 includes an input terminal Cin for receiving control signals from controller 4. A non-inverted output terminal Q of control circuit 15 is connected to the gate of NMOS FET 17, while inverted output terminal /Q of control circuit 15 is connected to the gate of NMOS FET 18. The drains of NMOS FETs 17 and 18 are connected to make a power input terminal Vin. The source of NMOS FET 17 is coupled with a DC—DC converter 16. The output of DC—DC converter 16 and the source of NMOS FET 18 are coupled at a power output terminal Vout of power supply controller 7.

External information processing device 30 provides voltage Va at the power input terminal Vin and controller 4 provides the dormant-state detection signal at the input terminal Cin. The power output terminal Vout is connected with memory portion 6 for supplying power thereto. DC—DC converter 16 outputs the voltage Vb when it receives the voltage Va.

With this configuration, when the power supply controller receives the dormant-state detection signal from controller 4 indicating that the data access operation to memory portion 6 is performed less frequently than the predetermined value, control circuit 15 outputs an "H" signal from the non-inverted output terminal Q to activate NMOS FET 17 and an "L" signal from the inverted output terminal /Q to deactivate NMOS FET 18. Accordingly, DC—DC converter 16 receives the voltage Va from the power input terminal Vin through NMOS FET 17, converts the voltage to Vb, and outputs it to memory portion 6 through the power output terminal Vout.

When the power supply controller does not receive the dormant-state detection signal from controller 4, control circuit 15 outputs an "L" signal from the non-inverted output terminal Q to inactivate NMOS FET 17 and an "H" signal from the inverted output terminal /Q to activate NMOS FET 18. Accordingly, the voltage Va is output to memory portion 6 from the power output terminal Vout through NMOS FET 18. It should be noted that NMOS FETs 17 and 18 are neither in an active state at the same time nor in an inactive state at the same time.

Figure 3:
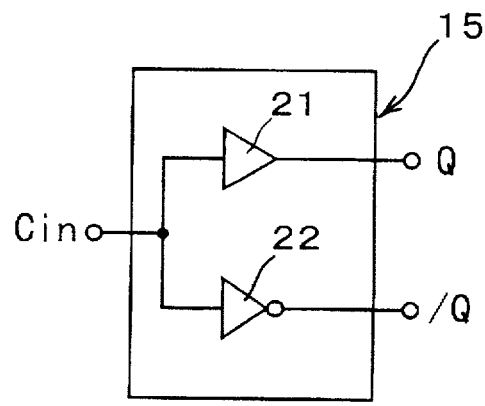
FIG. 3 is a circuit diagram of control circuit 15 shown in FIG. 2.
Figure 4:
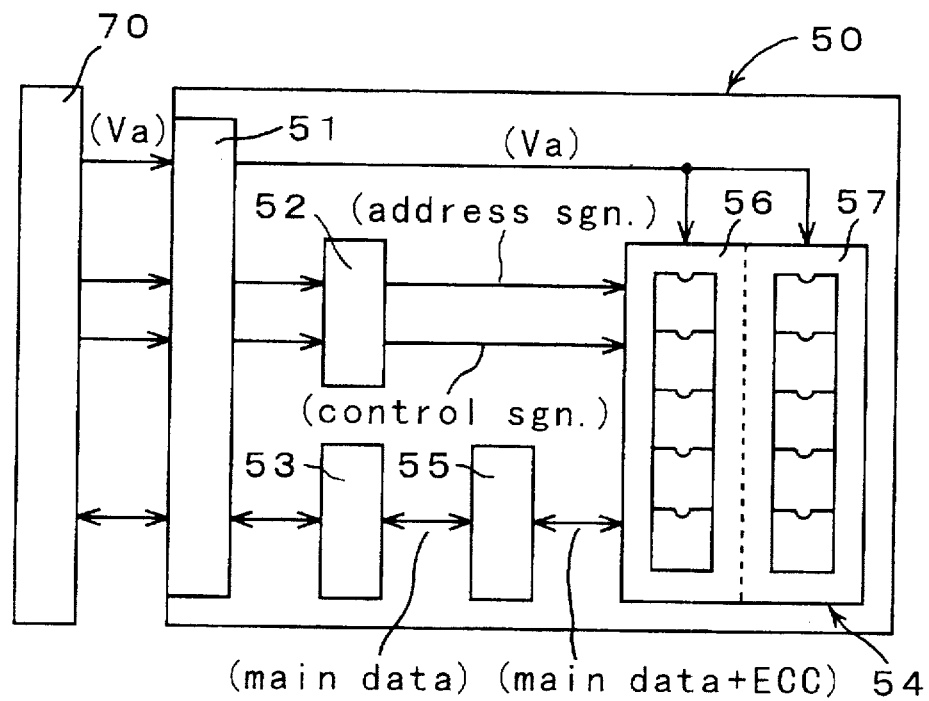
FIG. 4 is a schematic block diagram of a conventional memory card implemented with SRAM.

FIG. 3 shows a circuit for control circuit 15 in a case in which the dormant-state signal from controller 4 to power supply controller 7 is a binary signal. As seen in FIG. 3 control circuit 15 comprises a buffer circuit 21 and an inverter circuit 22. If controller 4 produces an "H" dormant-state detection signal at the input terminal Cin when it determines that the data access operation to memory portion 6 is performed less frequently than the predetermined value and otherwise produces an "L" signal, the output of buffer circuit 21 is coupled with NMOS FET 17 through the non-inverted output terminal Q, while the output of inverter circuit 22 is coupled with NMOS FET 18 through the inverted output terminal /Q. The inputs of buffer circuit 21 and inverter circuit 22 are connected at the input terminal Cin.

In Embodiment 1 memory portion 6 comprises two separate memory portions: main memory 8 for storing main data and ECC memory 9 for storing ECCs. The memory portion 6, however, may be configured with a single SRAM memory in which the main data is stored with the corresponding ECC following immediately after the main data.

As described above, since memory card 1 of Embodiment 1 of the present invention is implemented with SRAM and conforms to both the PCMCIA and ATA standards, main data from external information processing device 30 must be configured in units of 512 bytes. This allows for the capacity of ECC memory 9 to be dramatically reduced compared to that of main memory 8.

Controller 4 sends a predetermined detection signal to power supply controller 7 when it detects that the data access operation to memory portion 6 is performed less frequently than a predetermined value. Power supply controller 7, on receiving the predetermined detection signal, reduces the voltage Va, which is supplied by information processing device 30 and is high enough to keep the IC memory of memory portion 6 in the active state, to the lowest voltage Vb necessary for the IC memory of memory portion 6 to retain its stored data. Then power supply controller 7 outputs the voltage Vb to memory portion 6. When the data access operation is performed more frequently than the predetermined value and controller 4 ceases to produce the detection signal, power supply controller 7 outputs to memory portion 6 the same voltage, Va, as it receives from information processing device 30.

An external information processing device supplies a power voltage to the memory card. Since power supply controller 7 lowers the supplied voltage to be provided to memory portion 6 to the lowest value, Vb, necessary for memory portion 6 to retain its stored data, then, when memory portion 6 is in the dormant state in which the data access operation to the memory portion is performed less frequently than a predetermined value, the current consumed in memory portion 6 is substantially reduced. Therefore, if information processing device 30 is operated with a battery, the battery consumption will be minimized and its lifetime will be extended.

As described above the memory card of the present invention implemented with SRAM and in conformity with both the PCMCIA and ATA standards requires input main data from an external information processing device to be configured in units of 512 bytes. Therefore, the number of bits m in Equation (1) is 512×8 bits for the main data of this configuration and the number of the ECC bits k is determined to be 14. If the main memory and the ECC memory each are formed with IC memory of the x8 bit configuration, storing a unit: of data requires 2 byte capacity for the ECC memory portion in contrast to 512 byte capacity for the main memory portion. This means that only 0.4% of the main memory capacity is needed for the ECC memory capacity, which is a substantial improvement over the 100% required by the prior art.

The power necessary to operate the memory portion is supplied by an external information processing device through the power voltage converter. The supplied voltage Va allows the SRAM of the memory portion to be in the active state for writing and reading data. The detection portion sends a predetermined detection signal to the power voltage converter when it detects that the data access operation to the memory portion is performed less frequently than a predetermined value. The power voltage converter, when receiving the predetermined detection signal, reduces the voltage Va, supplied by the information processing device, to the lowest voltage Vb necessary for the SRAM of the memory portion to retain its stored data. Then the power voltage converter outputs the voltage Vb to the memory portion. When the data access operation is performed more frequently than the predetermined value and the detection portion ceases to produce the detection signal, the power voltage converter outputs to the memory portion the same voltage Va as it receives from the information processing device.

An external information processing device supplies the power voltage to the memory card. Since the power voltage converter lowers the supplied voltage to be provided to the memory portion to the lowest value, Vb, necessary for the memory portion to retain its stored data, then, when the memory portion is in the dormant state in which the data access operation to the memory portion is performed less frequently than a predetermined value, the current consumed in the memory portion is substantially reduced. Therefore, if the information processing device is operated with a battery, the battery consumption will be minimized and its lifetime will be extended.

Although the present invention has been fully described in connection with the preferred embodiment thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A memory card, with improved reliability by means of an ECC and in conformity with the ATA standard, used as a PC card in conformity with the PCMCIA standard comprising:
   a memory portion employing SRAM;
   a detection portion for detecting frequency of the data access operations to said memory portion and producing a predetermined detection signal when the detected frequency is lower than a predetermined value; and
   a power supply voltage converter for converting the power supply voltage provided by an external information processing device while receiving the predetermined detection signal from said detection portion and for supplying the converted voltage as a power supply voltage to said memory portion,
   wherein said power supply voltage converter lowers the power supply voltage for said memory portion when receiving the predetermined detection signal from said detection portion.

2. The memory card of claim 1, wherein said memory portion comprises a main memory portion for storing main data and an ECC memory portion for storing ECCs generated for the main memory.

3. The memory card of claim 1, wherein said power supply voltage converter, when receiving the predetermined detection signal from said detection portion, lowers the power supply voltage Va, which is provided from an external information processing device and is needed in order for said memory portion to be in the active state in which the SRAM of said memory portion performs writing and reading data, to the power supply voltage Vb which is the lowest voltage necessary for the SRAM to retain the stored data therein.

4. The memory card of claim 3, wherein said power supply voltage converter supplies said memory portion with the same voltage Va as that received from the external information processing device when said power supply voltage converter does not receive the predetermined detection signal from said detection portion.

* * * * *